US008497200B2

(12) United States Patent
Matejat et al.

(10) Patent No.: US 8,497,200 B2
(45) Date of Patent: Jul. 30, 2013

(54) METHOD TO FORM SOLDER ALLOY DEPOSITS ON SUBSTRATES

(75) Inventors: Kai-Jens Matejat, Berlin (DE); Sven Lamprecht, Berlin (DE); Ingo Ewert, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 13/701,499

(22) PCT Filed: Jun. 23, 2011

(86) PCT No.: PCT/EP2011/060579
§ 371 (c)(1),
(2), (4) Date: Dec. 1, 2012

(87) PCT Pub. No.: WO2012/004136
PCT Pub. Date: Jan. 12, 2012

(65) Prior Publication Data
US 2013/0082091 A1    Apr. 4, 2013

(30) Foreign Application Priority Data
Jul. 5, 2010 (EP) .................................. 10168474

(51) Int. Cl.
*H01L 29/22* (2006.01)

(52) U.S. Cl.
USPC ........... 438/614; 257/772; 257/779; 438/612; 438/613

(58) Field of Classification Search
USPC ................. 438/614, 612, 613; 257/772, 779
See application file for complete search history.

(56) References Cited

U.S. PATENT DOCUMENTS

| 6,281,106 | B1 * | 8/2001 | Higdon et al. | 438/613 |
| 6,492,197 | B1 | 12/2002 | Rinne | |
| 2007/0202682 | A1 * | 8/2007 | Yamamoto et al. | 438/612 |
| 2007/0218676 | A1 | 9/2007 | Wang et al. | |
| 2008/0023819 | A1 | 1/2008 | Chia et al. | |
| 2009/0212427 | A1 * | 8/2009 | Mis et al. | 257/737 |
| 2012/0325671 | A2 * | 12/2012 | Keigler et al. | 205/118 |

OTHER PUBLICATIONS

PCT/EP2011/060579; PCT International Search Report and Written Opinion of the International Searching Authority dated Dec. 22, 2011.

* cited by examiner

*Primary Examiner* — Kimberly Rizkallah
*Assistant Examiner* — Errol Fernandes
(74) *Attorney, Agent, or Firm* — Renner, Otto, Boisselle & Sklar, LLP

(57) ABSTRACT

Method of forming a solder alloy deposit on a substrate comprising i) provide a substrate including a surface bearing electrical circuitry that includes at least one inner layer contact area, ii) form a solder mask layer on the substrate surface and patterned to expose at least one contact area, iii) contact the entire substrate area including the solder mask layer and the at least one contact area with a solution to provide a metal seed layer on the substrate surface, iv) form a structured resist layer on the metal seed layer, v) electroplate a first solder material layer containing tin onto the conductive layer, vi) electroplate a second solder material layer onto the first solder material layer, vii) remove the structured resist layer and etch away an amount of the metal seed layer sufficient to remove the metal seed layer from the solder mask layer area and reflow the substrate.

11 Claims, 4 Drawing Sheets

FIG.1 Solder mask defined pad

FIG.2 Non-solder mask defined pad

METHOD TO FORM SOLDER ALLOY DEPOSITS ON SUBSTRATES

FIELD OF THE DISCLOSURE

The invention relates to the formation of solder alloy deposits by electroplating and to solder joints between e.g., IC substrates and active components.

BACKGROUND OF THE INVENTION

Since the introduction of the flip chip technology by IBM in the early 1960s, the flip chip devices have been mounted on an expensive ceramic substrate where the thermal expansion mismatch between the silicon chip and the ceramic substrate is less critical. In comparison with wire bonding technology, the flip chip technology is better able to offer higher packaging density (lower device profile) and higher electrical performance (shorter possible leads and lower inductance). On this basis, the flip chip technology has been industrially practiced for the past 40 years using high-temperature solder (controlled-collapse chip connection, C4) on ceramic substrates. However, in recent years, driven by the demand of high-density, high-speed and low-cost semiconductor devices for the trend of miniaturization of modern electronic products, the flip chip devices mounted on a low-cost organic circuit board (e.g. printed circuit board or substrate) with an epoxy underfill to mitigate the thermal stress induced by the thermal expansion mismatch between the silicon chip and organic board structure have experienced an obviously explosive growth. This notable event of low-temperature flip chip joints and organic-based circuit board has enabled the current industry to obtain inexpensive solutions for fabrication of flip chip devices.

In the current low-cost flip chip technology, the top surface of the semiconductor integrated circuit (IC) chip has an array of electrical contact pads. The organic circuit board has also a corresponding grid of contacts. The low-temperature solder bumps or other conductive adhesive material are placed and properly aligned in between the chip and circuit board. The chip is flipped upside down and mounted on the circuit board, in which the solder bumps or conductive adhesive material provide electrical input/output (I/O) and mechanical interconnects between the chip and circuit board. For solder bump joints, an organic underfill encapsulant may be further dispensed into the gap between the chip and circuit board to constrain the thermal mismatch and lower the stress on the solder joints.

In general, for achieving a flip chip assembly by solder joints, the metal bumps, such as solder bumps, gold bumps or copper bumps, are commonly pre-formed on the pad electrode surface of the chip, in which the bumps can be any shape, such as stud bumps, ball bumps, columnar bumps, or others. The corresponding solder bumps (or say presolder bumps), typically using a low-temperature solder, are also formed on the contact areas of the circuit board. At a reflow temperature, the chip is bonded to the circuit board by means of the solder joints. After dispensing of an underfill encapsulant, the flip chip device is thus constructed. Such methods are well known in the art and typical examples of the flip chip devices using solder joints are for example described in U.S. Pat. No. 7,098,126 (H.-K. Hsieh et al.).

Currently, the most common method for formation of presolder bumps on the circuit board is the stencil printing method. Some prior proposals in relation to the stencil printing method can be referred to U.S. Pat. No. 5,203,075 (C. G. Angulas et al.), U.S. Pat. No. 5,492,266 (K. G. Hoebener et al.) and U.S. Pat. No. 5,828,128 (Y. Higashiguchi et al.). Solder bumping technique for flip chip assemblies requires design considerations regarding both bump pitch and size miniaturization. According to practical experiences, the stencil printing will become infeasible once the bump pitch is decreased below 0.15 millimeter. In contrast, the solder bumps deposited by electroplating offer the ability to further reduce bump pitch down to below 0.15 millimeter. The prior proposals in relation to electroplate bumps on the circuit board for flip chip bonding can be found in U.S. Pat. No. 5,391,514 (T. P. Gall et al.) and U.S. Pat. No. 5,480,835 (K. G. Hoebener et al.). Although electroplate solder bumping on the circuit board offers finer bump pitch over stencil printing, it presents several challenges for initial implementation.

A multi-step process to form solder on an organic substrate is described in U.S. Pat. No. 7,098,126 (H.-K. Hsieh et al.). In the method, there is initially provided an organic circuit board including a surface bearing electrical circuitry that includes at least one contact area. A solder mask layer that is placed on the board surface and patterned to expose the pad. Subsequently, a metal seed layer is deposited by physical vapor deposition, chemical vapor deposition, electroless plating with the use of catalytic copper, or electroplating with the use of catalytic copper, over the board surface. A resist layer with at least an opening located at the pad is formed over the metal seed layer. A solder material is then formed in the opening by electroplating. Finally, the resist and the metal seed layer beneath the resist are removed. To apply this method various patterning steps are required which is not desired from the overall standpoint of process efficiency. Furthermore the method has its limitations if the distance between adjacent contact areas (pitch) is very small as a result of the miniaturization of electronic devices.

A fabrication method of conductive bump structures of circuit boards is disclosed in US 2006/0219567 A1. A solder material is electroplated onto the substrate which is partially protected by a solder mask but not with an additional resist. Next, an adhesive layer is deposited onto the layer of solder material. Said adhesive layer is then patterned in a way that the solder material coated connecting pads are protected during the following etching step. Solder material which is not needed for the solder depots is then etched away leaving only the etch resist protected solder depot above the connecting pads. Said adhesive layer serves both as a metal resist for back etching of the solder material and later on as a corrosion protection for the solder material.

The patent document U.S. Pat. No. 7,174,630 B2 discloses a method for manufacturing solder deposits. A first resist layer is deposited onto the substrate surface and patterned followed by electroplating of a first metal layer. Next, a second resist layer is deposited onto the substrate surface and patterned followed by electroplating of a second metal layer. Said process requires two distinct resist application, structuring and removal procedures which result in additional, undesired process steps.

Accordingly, there is a need to provide a method for forming solder deposits on substrates like circuit boards, which involves a reduced number of process steps. Furthermore, there is a need to offer a plating method yielding solder material of high uniformity in terms of solder alloy composition which is suitable to form solder deposits on very fine structures also.

SUMMARY OF THE DISCLOSURE

It is therefore an objective of the present invention to provide an electroplating method of solder material layers to produce a uniform layer and volume of a solder alloy deposit on a substrate. Such a method should be suitable to fill recess structures possessing high aspect ratios without leaving voids or dimples. Furthermore, the solder alloy deposit should have the desired alloy composition with the desired melting point after reflow operations. The preferred solder alloy deposits are ternary alloys Sn—Ag—Cu and quaternary alloys Sn—Ag—Cu—Ni and are referred to the acronym SAC-alloys (Sn—Ag—Cu(—Ni)-alloys). The solder alloy deposit composition after reflow operations is controlled by the volumes and compositions of the before deposited metal seed layer, first electroplated solder material layer and second electroplated solder material layer.

Another object of the present invention is to provide a method for solder alloy deposition having a reduced number of plating steps and which is universally applicable even when the solder resist openings have different dimensions.

Another objective of the present invention is to provide a method to form a metal seed layer on a non-conductive substrate, e.g. a printed circuit, which is used to produce electroplate solder for forming flip chip solder joints and board to board solder joints. In addition, the metal seed layer serves as a source for the alloy formation during reflow operations, e.g., the Cu component of a later to form SAC-alloy is provided by said metal seed layer.

In summary, a method of fabricating electroplated solder alloy deposits on a substrate for forming flip chip solder joints and board to board solder joints is disclosed. According to the present invention, there is provided a non-conductive substrate like a circuit board including a surface bearing electrical circuitry which includes at least one contact area. Such contact area can be any conductive surface area, e.g. a contact pad or the topmost area of a circuitry facing outside the substrate.

After applying a solder mask on part of the surface of the substrate and forming at least one solder mask opening which exposes the at least one contact area a conductive seed layer is formed on the entire surface area.

Next, a resist layer is deposited onto the metal seed layer and structured to expose the at least one solder mask opening and the at least one contact area.

A first solder material layer preferably containing tin is then electroplated on the conductive areas of the substrate to form a solder deposit.

Thereafter, a second solder material layer preferably consisting of a tin alloy is electroplated onto the first solder material layer. The resist layer on the metal seed layer is removed. Also removed is the metal seed layer from the solder mask layer area.

The as treated substrate is then subjected to a reflow operation wherein the first solder material layer melts and the metal seed layer and the second solder material layer are dissolved into the molten first solder material layer forming the alloy solder deposit having the desired composition.

Figure 1A:
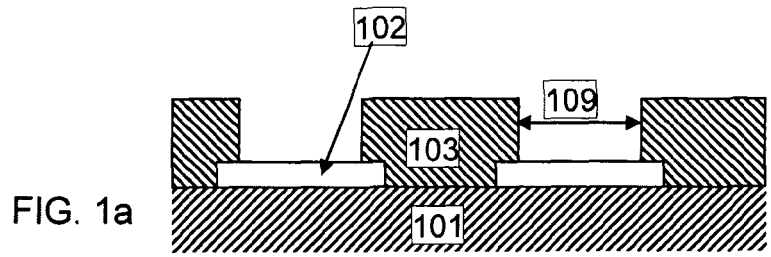
FIG. 1 shows a method to obtain a solder mask defined pad with a blind micro via (BMV) possessing an electroplated alloy solder deposit having a desired composition.

101 Non-conductive substrate
102 Contact pad
103 Solder mask layer
104 Metal seed layer
105 Resist layer
106 First solder material layer
107 Second solder material layer
108 Uniform solder alloy deposit
109 Solder mask opening
110 Resist opening

DETAILED DESCRIPTION OF THE INVENTION

The invention provides a method of forming a solder alloy deposit having a homogeneous and targeted composition on a substrate by depositing a metal seed layer preferably consisting of copper or a copper alloy, electroplating a first solder material layer preferably consisting of tin and thereafter electroplating a second solder material layer preferably consisting of a tin alloy. The process is particularly suitable for fabricating solder bumps on a circuit board, IC substrate or interposer. The inventive method leads to solder bumps with good plating uniformity and homogeneous elemental composition.

The term "homogeneous composition" refers to a homogeneous distribution of chemical elements in the solder deposit after reflowing.

The terms "uniformity" and "uniform refer to a uniform plated volume and layer thickness which leads after reflowing to solder alloy deposits of similar or equal height.

The term "elemental composition" refers to the concentration of chemical elements in a volume of a material such as a second solder material layer 107.

The method is in more detail described below. The figures shown herein are simply illustrative of the process. The figures are not drawn to scale, i.e. they do not reflect the actual dimensions or features of the various layers in the chip package structure. Like numbers refer to like elements throughout the description.

Figure 1B:
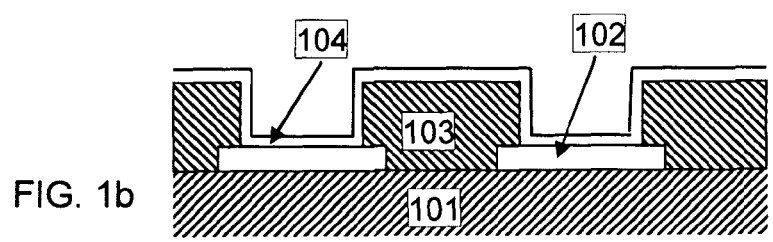
Figure 1C:
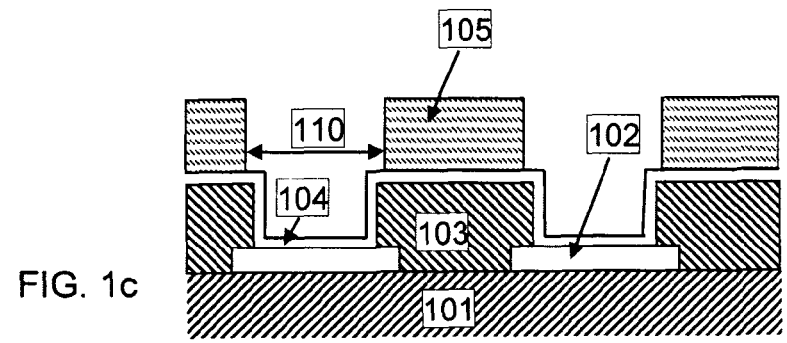
Figure 1D:
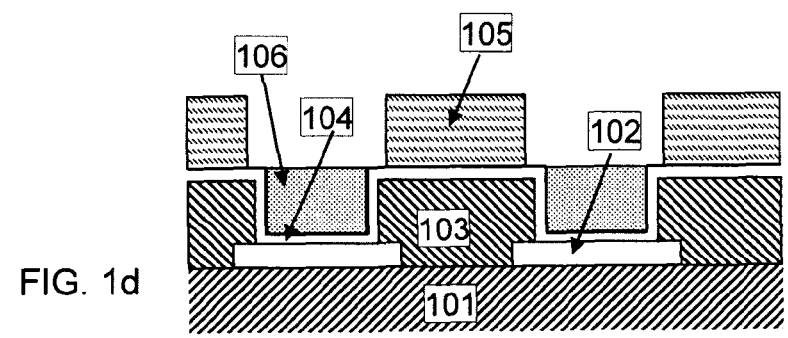
Figure 1E:
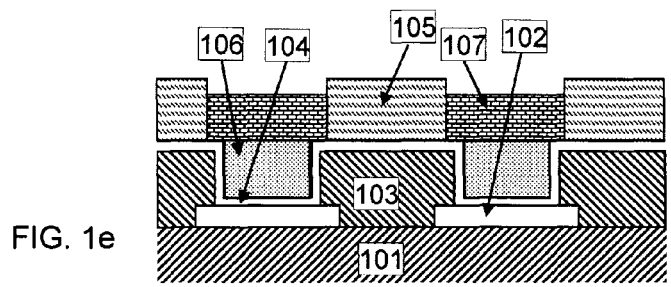
Figure 1F:
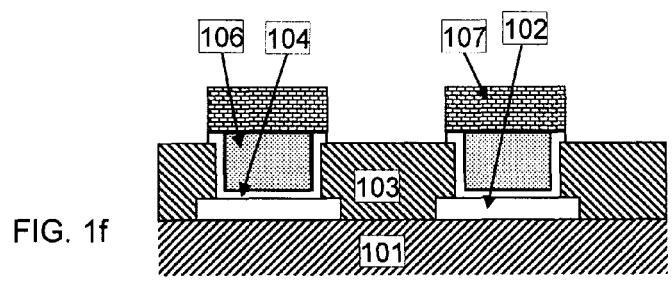
Figure 1G:
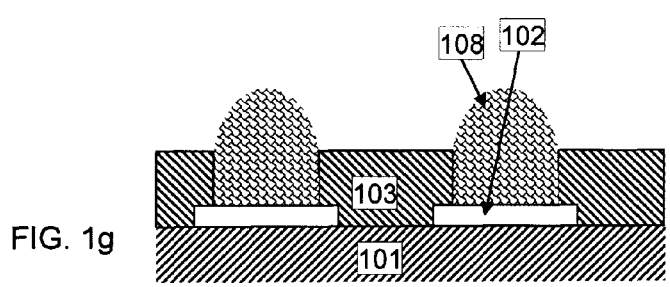

Now referring to FIG. 1, in accordance with a preferred embodiment of the present invention, there is provided a non-conductive substrate 101, which has contact inner layer pads 102 as the contact area embodiment (FIG. 1 a). Said inner layer contact pad 102 is formed typically from a metal, such as copper. The non-conductive substrate 101 can be a circuit board or an IC substrate which may be made of an organic material or a fiber-reinforced organic material or a particle-reinforced organic material, etc., for example, epoxy resin, polyimide, bismeleimide triazine, cyanate ester, polybenzocyclobutene, or glass fiber composite thereof, etc.

A solder mask layer 103 is deposited on the surface of said non-conductive substrate 101.

The solder mask layer 103 is a permanent solder mask and remains attached to the surface of the non-conductive substrate 101 after manufacturing of the printed circuit board.

The solder mask layer 103 is deposited onto the surface of the non-conductive substrate 101 by known techniques. Examples applicable to the present invention are screen printing and/or photo lithographic processes. Various types of solder masks can be used in accordance with the present invention: UV-hardening solder masks, thermal curable two-component solder masks and photo imageable solder masks.

Optionally, a barrier layer is formed on the contact pad 102 (not shown in FIG. 1). The barrier layer can be an adhesive layer of nickel, a nickel alloy or a protective layer of gold. Said barrier layer may also be made of nickel, nickel-phosphor, palladium, palladium-phosphor, silver, tin, nickel/palladium, chromium/titanium, palladium/gold, or nickel/palladium/gold, etc., which can be made by electoplating, electroless plating, immersion, or physical vapour deposition, etc.

In order to fabricate a uniform solder alloy deposit preferably containing tin by electroplating on a non-conductive surface and reflowing, a metal seed layer 104 formed on the non-conductive surface is required to initiate the electroplating. Such a metal seed layer 104 is depicted in FIG. 1 *b*. In general, the metal seed layer 104 is for example formed by electroless deposition in the conventional manufacturing industry of non-conductive surfaces and well known in the art.

According to the present invention the metal seed layer 104 is deposited over the entire surface of the non-conductive substrate 101 including the contact pad area 102 and the solder mask layer 103. The most preferred metal seed layer 104 materials are copper and copper alloys such as copper-nickel alloys, copper-ruthenium alloys and copper-rhodium alloys.

The metal seed layer 104 is electrically conductive, provides adhesion, permits the exposed portions of its upper surface to be electroplated, and can prevent migration of the subsequent solder deposit metal to the underlying metal of the contact area. Alternatively, the metal seed layer may be composed of two metal layers.

The non-conductive substrates can be activated by various methods which are described, for example, in Printed Circuits Handbook, C. F. Coombs Jr. (Ed.), 6$^{th}$ Edition, McGraw Hill, pages 28.5 to 28.9 and 30.1 to 30.11. These processes involve the formation of a conductive layer comprising carbon particles, Pd-ions, Pd colloids or conductive polymers.

Some of these processes are described in the patent literature and examples are given below:

European patent EP 0 616 053 describes a process for applying a metal coating to a non-conductive substrate (without an electroless coating) comprising:
a. contacting said substrate with an activator comprising a noble metal/Group IVA metal sol to obtain a treated substrate;
b. contacting said treated substrate with a self accelerating and replenishing immersion metal composition having a pH above 11 to pH 13 comprising a solution of;
   (i) a Cu(II), Ag, Au or Ni soluble metal salt or mixtures thereof,
   (ii) a Group IA metal hydroxide,
   (iii) a complexing agent comprising an organic material having a cumulative formation constant log K of from 0.73 to 21.95 for an ion of the metal of said metal salt.

This process results in a thin conductive layer which can be used for subsequent electrocoating. This process is known in the art as the "Connect" process.

U.S. Pat. No. 5,503,877 describes the metallisation of non-conductive substrates involving the use of complex compounds for the generation of metal seeds on a non-metallic substrate. These metal seeds provide for sufficient conductivity for subsequent electroplating. This process is known in the art as the so-called "Neoganth" process.

U.S. Pat. No. 5,693,209 relates to a process for metallisation of a non-conductive substrate involving the use of conductive pyrrole polymers. The process is known in the art as the "Compact CP" process.

European patent 1 390 568 B1 also relates to direct electrolytic metallisation of non-conductive substrates. It involves the use of conductive polymers to obtain a conductive layer for subsequent electrocoating. The conductive polymers have thiophene units. The process is known in the art as the "Seleo CP" process.

Finally, the non-conductive substrate can also be activated with a colloidal or an ionogenic palladium ion containing solution, methods for which are described, for example, in Printed Circuits Handbook, C. F. Coombs Jr. (Ed.), 6$^{th}$ Edition, McGraw Hill, pages 28.9 and 30.2 to 30.3.

Subsequent electroless plating of a thin intermediate metal coating can optionally been carried out in order to enhance in thickness the metal seed layer 104. With assistance of the seed layer, electroplating of the solder material layers according to the present invention can then be carried out.

According to the present invention, said conductive seed layer 104 may be made of a single metal layer, a single metal alloy layer or made of multilayer of at least two distinct single layers. Metals and metal alloys suitable as conductive seed layer are selected from the group consisting of copper, tin, cobalt, nickel, silver, tin-lead alloy, copper-nickel alloy, copper-chromium alloy, copper-ruthenium alloy, copper-rhodium alloy, copper-silver alloy, copper-iridium alloy, copper-palladium alloy, copper-platinum alloy, copper-gold alloy and copper-rare earth alloy, copper-nickel-silver alloy, copper-nickel-rare earth metal alloy. Copper and copper alloys are preferred as a conductive seed layer 104.

In accordance with a preferred embodiment of the present invention, said metal seed layer 104 can also be formed by an electroless plating method, wherein the catalytic metal does not use noble metal but uses copper as the catalytic metal. The typical examples for forming such a catalytic copper on a non-conductive surface can be found in the U.S. Pat. Nos. 3,993,491 and 3,993,848.

The thickness of said metal seed layer 104 preferably is less than 0.1 millimeter and more preferably between 0.0001 millimeter and 0.005 millimeter. Depending on the solubility of said metal seed layer 104 in the solder material layers, said metal seed layer 104 can either completely dissolve into the solder deposit or still at least partially exist after the reflow process. In a preferred embodiment of the present invention the metal seed layer 104 is completely dissolved into the solder material layers during or after reflow.

A thinner said metal seed layer 104 is preferred, since a thinner seed layer can be removed faster in the etching solution. Because of shorter contact time in the etching bath the damages to said solder mask layer 103 by said etching solution will be lowered down to an acceptable low level.

Referring now to FIG. 1 *c* a resist layer 105 is applied to the solder mask layer 103 and patterned with known techniques in order to expose the solder mask openings and the at least one contact pad 102.

Next, a first solder material layer 106 is then formed on the metal seed layer 104 by electroplating (FIG. 1 *d*). The first solder material for the first solder material layer 106 is selected from the group consisting of tin, indium, bismuth and alloys containing at least one of the aforementioned metals. The most preferred metal is pure tin.

Afterwards, a second solder material 107 is deposited onto the first solder material layer 106 by electroplating (FIG. 1 *e*). The second solder material contains at least one element selected from the group consisting of tin, lead, silver, gold, copper, bismuth, antimony, zinc, nickel, aluminium, magnesium, indium, tellurium, gallium, ruthenium, rhodium, iridium, palladium and platinum.

More preferably, the second solder material 107 is a tin alloy made by the mixture of tin and at least one of the elements selected from the group consisting of lead, silver, copper, bismuth, antimony, zinc, nickel, aluminium, magnesium, indium, tellurium, gallium, ruthenium, rhodium, iridium, palladium and platinum.

The most preferred second solder material for the second solder material layer 107 are tin-silver alloys.

In the preferred combination of first solder material layer 106 and second solder material 107, the first solder material layer 106 consists of pure tin and the second solder material layer 107 consists of a tin alloy.

In the most preferred combination of first solder material layer 106 and second solder material layer 107, the first solder material layer 106 consists of pure tin and the second solder material layer 107 consists of a tin-silver alloy.

Tin and tin alloy plating baths are known in the art. Commonly used tin or tin alloy plating bath compositions and process parameters for plating are described in the following.

Among other components of the bath may be added an anti-oxidant and a surfactant.

The source of $Sn^{2+}$ ions may be a soluble tin-containing anode, or, where an insoluble anode is used, a soluble $Sn^{2+}$ ion source. Tin methane sulfonic acid, $Sn(MSA)_2$, is a preferred source of $Sn^{2+}$ ions because of its high solubility. Typically, the concentration of the source of $Sn^{2+}$ ions is sufficient to provide between about 10 g/l and about 200 g/l of $Sn^{2+}$ ions into the bath, preferably between about 15 g/l and about 95 g/l, more preferably between about 40 g/l and about 60 g/l. For example, $Sn(MSA)_2$ may be added to provide between about 30 g/l and about 60 g/l $Sn^{2+}$ ions to the plating bath.

A preferred alloy is tin silver alloy. In such case the plating bath additionally contains a soluble silver salt, commonly used are nitrate, acetate, and preferably methane sulfonate. Typically, the concentration of the source of $Ag^+$ ions is sufficient to provide between about 0.01 g/l and about 1.5 g/l of $Ag^+$ ions into the bath, preferably between about 0.3 g/l and about 0.7 Wl, more preferably between about 0.4 g/l and about 0.6 g/l. For example, Ag(MSA) may be added to provide between about 0.2 g/l and about 1.0 g/l $Ag^+$ ions to the plating bath.

Anti-oxidants may be added to the baths of the present invention to stabilize the bath against oxidation of $Sn^{2+}$ ions in solution. Preferred anti-oxidants such as hydroquinone, catechol, and any of the hydroxyl, dihydroxyl, or trihydroxyl benzoic acids may be added in a concentration between about 0.1 g/l and about 10 g/l, preferably between about 0.5 g/l and about 3 g/l. For example, hydroquinone may be added to the bath at a concentration of about 2 g/l.

Surfactants may be added to promote wetting of the substrate. The surfactant seems to serve as a mild deposition inhibitor which can suppress three-dimensional growth to an extent, thereby improving morphology and topography of the film. It can also help to refine the grain size, which yields a more uniform bump. Exemplary anionic surfactants include alkyl phosphonates, alkyl ether phosphates, alkyl sulfates, alkyl ether sulfates, alkyl sulfonates, alkyl ether sulfonates, carboxylic acid ethers, carboxylic acid esters, alkyl aryl sulfonates, aryl alkylether sulfonates, aryl sulfonates, and sulfosuccinates.

The electrolytic plating bath of the present invention preferably has an acidic pH to inhibit anodic passivation, achieve better cathodic efficiency, and achieve a more ductile deposit. Accordingly, the bath pH is preferably between about 0 and about 3. In the preferred embodiment the pH of the bath is 0. Accordingly, the preferred acidic pH can be achieved using nitric acid, acetic acid, and methane sulfonic acid. In one preferred embodiment, the acid is methane sulfonic acid. The concentration of the acid is preferably between about 50 g/l and about 200 g/l, more preferably between about 70 g/l and about 120 g/l. For example, between about 50 g/l and about 160 g/l methane sulfonic acid can be added to the electroplating bath to achieve a bath of pH 0 and act as the conductive electrolyte.

Typical bath compositions are for example disclosed in: Jordan: The Electrode-position of Tin and its Alloys, 1995, p. 71-84.

Figure 2A:
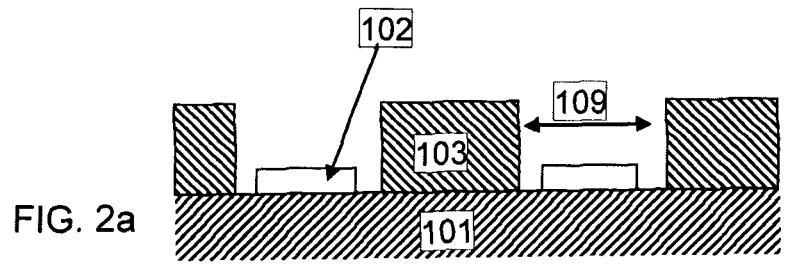
FIG. 2 shows a method to obtain a non-solder mask defined pad with a blind micro via (BMV) possessing an electroplated alloy solder deposit having a desired composition.
Figure 2B:
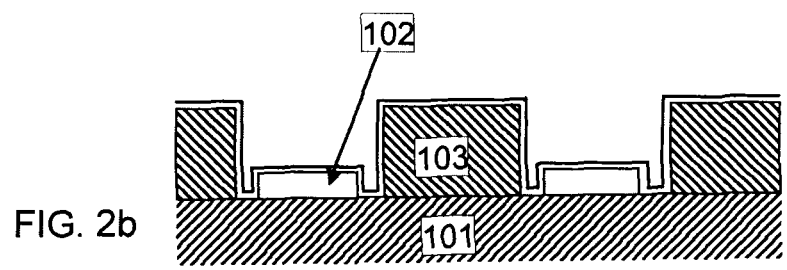
Figure 2C:
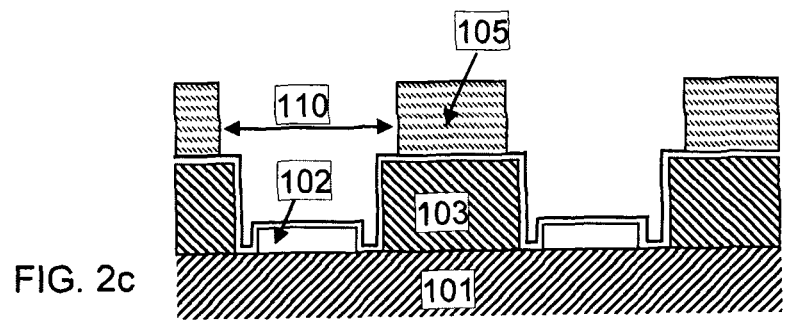
Figure 2D:
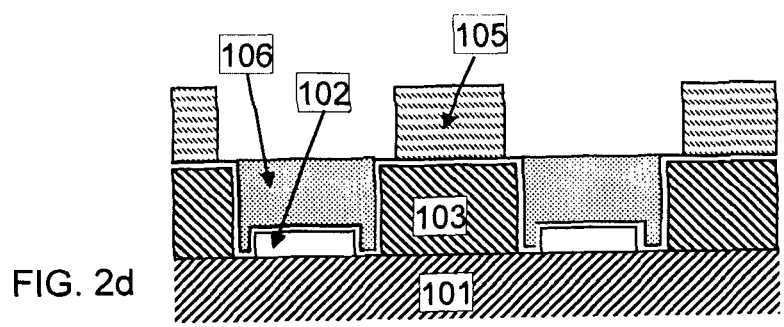
Figure 2E:
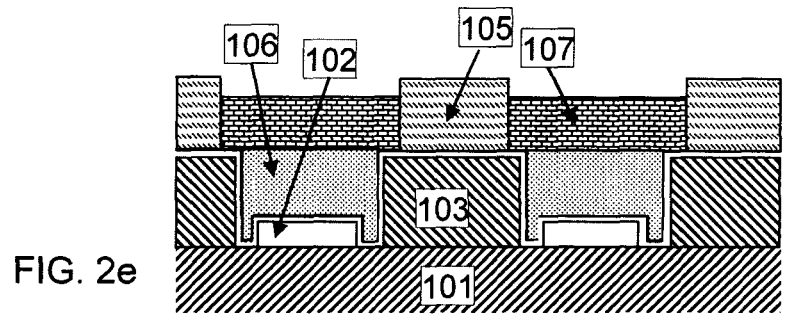
Figure 2F:
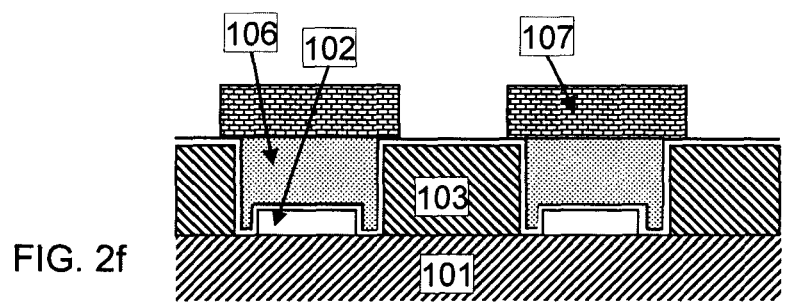
Figure 2G:
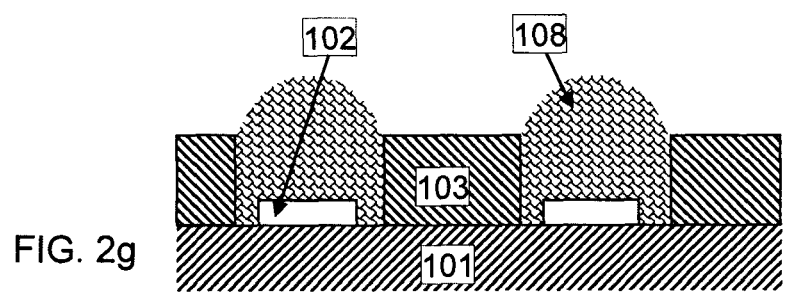

The plating of tin and tin alloys for solder depot plating can be performed by direct current (DC) or pulse plating. Pulse plating techniques are particularly suitable to fill structures of the present invention as shown in FIGS. 1 and 2. The advantages of pulse plating are better surface distribution uniformity and improved crystal structures with tin deposits possessing finer grain sizes and therefore better solderability properties. Also, higher applicable current density and therefore higher throughput can be obtained by pulse plating compared to DC plating.

Generally, current pulses at an effective current density of 1-20 $A/dm^2$ can be applied. Alternatively, operating of the bath with DC at a current density of 0.3-5 $A/dm^2$ can be performed.

For example, applying a tin pulse plating with a current density of 3 $A/dm^2$ yields an average thickness of the tin deposit of 40 µm within 30 min. plating time. The thickness variation on the surface is only +/−15%. Applying DC plating a maximum current density of only 1 $A/dm^2$ can be obtained. Plating time to obtain a thickness of the tin deposit of 40 µm is 86 min. The variation on the surface is +/−33%, thus much higher than for pulse plating.

Preferred pulse parameters are as follows:

The ratio of the duration of the at least one forward current pulse to the duration of the at least one reverse current pulse is adjusted to at least 1:0-1:7, preferably to at least 1:0.5-1:4 and more preferably to at least 1:1-1:2.5.

The duration of the at least one forward current pulse can be adjusted to preferably at least 5 ms to 1000 ms.

The duration of the at least one reverse current pulse is preferably adjusted to 0.2-5 ms and most preferably to 0.5-1.5 ms.

The peak current density of the at least one forward current pulse at the workpiece is preferably adjusted to a value of 1-30 $A/dm^2$. Particularly preferable is a peak current density of the at least one forward current pulse at the workpiece of 2-8 $A/dm^2$ in horizontal processes. In vertical processes the most preferred peak current density of the at least one forward current pulse at the workpiece is 1-5 $A/dm^2$.

The peak current density of the at least one reverse current pulse at the work piece will preferably be adjusted to a value of 0-60 $A/dm^2$. Particularly preferred is a peak current density of the at least one reverse current pulse at the workpiece of 0-20 $A/dm^2$ in horizontal processes. In vertical processes the most preferred peak current density of the at least one forward current pulse at the workpiece is 0-12 $A/dm^2$.

Anodes known in the art such as tin anodes can be used for the deposition of tin and tin alloys by electroplating. However, for tin alloys wherein the alloying metal is more noble than tin, e.g., silver, inert anodes such as titanium anodes, platinized titanium anodes and titanium mixed oxide anodes are preferred.

The solder mask openings 109 in the structure according to FIG. 1 preferably have a dimension of about 5-1.000 µm, preferably of about 10-500 µm and even more preferred 20-100 µm.

The width of the solder mask openings 109 varies between 5-250 µm, preferably of 10-50 µm (FIG. 1 a). The distance of the center points of adjacent contacts areas is denoted as pitch and ranges from 90-300 µm for IC substrates, and from 150-1.000 µm for printed circuits.

Referring to FIG. 1 f, the patterned resist layer 105 as well as the metal seed layer 104 is being removed from the solder mask layer 103. The removal preferably is performed by chemical etching an amount of the metal seed layer 104 from the solder mask layer area 103 leaving the first and second solder material layers 106 and 107 on the at least one contact area. The etching of copper and copper alloys, also known as stripping, can be performed electrolytically or chemically. Suitable etching solutions can be chosen applying routine experiments.

Also, mechanical polishing may be applied alone or in combination with electrolytical or chemical stripping to remove the metal seed layer 104.

Typical etching or stripping compositions for copper and copper alloys are for example disclosed in: Printed Circuits Handbook, C. F. Coombs Jr. (Ed.), 6$^{th}$ Edition, McGraw Hill, pages 34.6 to 34.18.

Typical etching compositions for copper and copper alloys are mixtures of persulfates and sulphuric acid, caro acid, mixtures of peroxides and mineral acids, mixtures of $CuCl_2$, peroxides and mineral acids, mixtures of $CuCl_2$ and ammonia.

Optionally, the substrate is then contacted with a post-treatment composition to prevent oxidation and discoloration of the tin or tin alloy surface. Suitable post-treatment compositions for said purpose are often based on inorganic or organic phosphorous containing compounds and mixtures thereof. Specific compositions are disclosed for example in EP 2 014 798 A1 and EP 1 716 949 B1.

At a reflow temperature, a flip chip or BGA joint can be formed. Furthermore, the metal seed layer 104, the first solder material layer and the second solder material layer dissolve into each other while forming a uniform alloy solder deposit 108 during reflow operations (FIG. 1 g). The present invention provides two modes of adjustment for the composition of said uniform alloy solder deposit 108. The composition of each of the at least one individual metal seed layers, first solder material layer and second solder material layer as well as their respective volumes after deposition are used to obtain a final alloy solder deposit 108 with a very defined composition, i.e. the desired melting temperature of the alloy solder deposit 108.

The preferred final solder alloy solder deposit 108 contains more than 50 wt.-% of tin.

The preferred silver concentration in the final solder alloy deposit 108 ranges from 1 to 6 wt.-%.

The preferred copper concentration in the final solder alloy deposit 108 ranges from 0.05 to 2 wt.-%.

In accordance with a preferred embodiment of the present invention, said electroplate solder bumps can be applied for forming flip chip joints and board to board solder joints.

The solder bumps can be any shape, such as stud bumps, ball bumps, columnar bumps, or others.

While this process sequence has been described in detail for a substrate according to FIG. 1 it is not limited to such and may be applied to all kind of substrates. An additional preferred embodiment of the present invention which can be treated accordingly is shown in FIG. 2.

According to the present invention, said solder mask layer 103 is not limited to cover a portion of said contact pad 102 surface. As shown in FIG. 2, said solder mask layer 103 is deposited on the surface of said non-conductive surface 101 but does not cover any portion of said contact pad 102 surface. In turn, said conductive seed layer 104 is formed. Subsequently, the solder deposit layers 106 and 107 are formed in said opening covering the contact pad 102. Such structure is referred to as non-solder mask defined pad substrate.

The following example further illustrates the present invention.

EXAMPLES

Example 1

An IC substrate is used having a contact pad structure according to FIG. 1 a.

The plating sequence is according to FIG. 1.

The IC substrate is first cleaned with standard procedures and then micro etched in an aqueous composition comprising hydrogen peroxide and sulphuric acid.

Next, a solder mask having a thickness of 25 µm (Lackwerke Peters, ELPEMER SD 2467 SG-DG (525)) is deposited onto the non-conductive substrate 101 (FIG. 1 a). The solder mask is photo structured in order to expose the at least one contact pad 102.

A metal seed layer 104 of copper is formed on the entire substrate surface (FIG. 1 b). For this the surface is first contacted with an acidic solution containing ionogenic palladium and then with a solution for electroless copper deposition.

Next, a dry film photo resist 105 (PM 250, DuPont) is laminated onto the solder mask layer 103. The dry film photo resist is patterned in a standard procedure (FIG. 1 c).

Thereafter, a tin layer (first solder material layer 106) is plated on the conductive layer (FIG. 1 d) from a bath containing:

45 g/l $Sn^{2+}$ as $Sn(MSA)_2$, 60 ml/l MSA (70% solution), 2 g/l Hydroquinone and 100 mg/l benzal acetone.

The pH of the bath is below 1, the temperature 25° C. Plating is for 20 min. DC plating is used applying the following parameters:

Average current density: 2.5 A/dm$^2$.

The solder mask openings according to FIG. 1 d are completely filled with tin solder material without any void formation.

Next, a tin-silver alloy layer (second solder material layer 107) is deposited onto the first solder material layer 106 by electroplating (FIG. 1 e) from a bath containing:

40 g/l $Sn^{2+}$ as $Sn(MSA)_2$, 1.5 g/l $Ag^+$ as $Ag(MSA)$, 60 ml/l MSA (70% solution), 2 g/l Hydroquinone and 100 mg/l benzal acetone.

The pH of the bath is below 1, the temperature 25° C. Plating is for 15 min. DC plating is used applying the following parameters:

Average current density: 2 A/dm$^2$.

The resist openings 110 according to FIG. 1 e are filled with a tin-silver alloy material without any void formation.

After deposition of the first solder material layer 106 and the second solder material layer 107 the patterned dry film photo resist is removed with an aqueous solution of 2 wt.-% potassium carbonate (FIG. 1 f).

The metal seed layer 104 on the solder mask layer 103 is thereafter removed by treatment in a solution containing 30 vol.-% nitric acid at a temperature of 40° C. for 1 min (FIG. 1 f). After the etching process the metal seed layer of copper 104 on the solder mask area 103 has been entirely removed (FIG. 1 f).

The substrate is then subjected to a reflow operation wherein the metal seed layer 104, the first solder material 106 and the second solder material 107 form a uniform SAC-alloy solder deposit 108.

The tin solder deposit shows a very homogenous surface distribution and is whisker free. It is suited to be soldered to a chip or circuit.

Example 2

A substrate having solder mask openings with a diameter of 50 μm and a height of 20 μm is coated with an electrolessly plated copper-nickel as the metal seed layer 104. A resist layer is deposited and resist openings 110 with a diameter of 80 μm and a height of 50 μm are formed. Then, the solder mask openings 109 and 15 μm in terms of height of the resist openings 110 are filled with tin as the first solder material layer 106 by electroplating. Next, a tin-silver alloy is electroplated as the second solder material layer 107 onto the first solder material layer 106 filling 15 μm in terms of height of the resist openings 110 by electroplating.

The metal seed layer 104 has a thickness of 0.2 μm and a weight of 1.055 μg. Said metal seed layer consists of 95 wt.-% copper and 5 wt.-% nickel.

The weight of tin deposited as the first solder material layer 106 in each opening is 83.7 μg.

The weight of tin-silver alloy deposited as the second solder material layer 107 in each opening is 55 μg and the silver content is 6 wt.-%.

Next, the resist layer 106 is removed and the substrate is subjected to a reflow operation. The resulting solder alloy deposit 108 has a uniform composition of 96.9 wt.-% tin, 2.36 wt. % silver, 0.75 wt-% copper and 0.04 wt.-% nickel, which resembles the composition of a typical quaternary SAC-alloy used as solder.

Example 3

Example 2 was repeated with a solder mask opening diameter of 50 μm and a resist opening 110 diameter of 60 μm. A copper layer having a thickness of 0.25 μm and a nickel content of 5 wt.-% was deposited as the metal seed layer 104. A pure tin layer having a weight of 90.6 μg was deposited as the first solder material layer 106 by electroplating. Next, a tin-silver alloy layer having a height of 10 μm and a weight of 20.6 μg is deposited as the second solder material layer 107 into the resist openings 110 by electroplating. Said second solder material layer 107 contains 6 wt.-% of silver.

Next, the resist layer 106 is removed and the substrate is subjected to a reflow operation. The resulting solder alloy deposit 108 has a uniform composition of 98.1 wt.-% tin, 1.1 wt. % silver, 0.76 wt-% copper and 0.04 wt.-% nickel, which resembles the composition of a typical quaternary SAC-alloy used as solder.

The invention claimed is:

1. A method of forming a solder alloy deposit on a substrate comprising the following steps:
   i) provide a substrate including a surface bearing electrical circuitry that includes at least one contact area,
   ii) form a solder mask layer that is placed on the substrate surface and patterned to expose the at least one contact area,
   iii) contact the entire substrate area including the solder mask layer and the at least one contact area with a solution suitable to provide a metal seed layer on the substrate surface,
   iv) form a resist layer on the metal seed layer and create openings in the resist layer which expose the solder mask openings and the at least one contact area,
   v) electroplate a first solder material layer consisting of pure tin onto the metal seed layer,
   vi) electroplate a second solder material layer consisting of a tin-silver alloy onto the first solder material layer,
   vii) remove the resist layer and etch away an amount of the metal seed layer sufficient to remove the metal seed layer from the solder mask layer area leaving two stacked solder material layers on the at least one contact area,
   viii) reflow the substrate and thereby form a solder alloy deposit from the metal seed layer, the first solder material layer and the second solder material layer,
   wherein the composition of the solder alloy deposit is controlled by the volumes of the metal seed layer, the first solder material layer and the second solder material layer and their respective elemental compositions, and
   wherein the solder alloy deposit contains more than 50 wt.-% of tin, 1 to 6 wt.-% of silver and 0.05 to 2 wt.-% of copper.

2. The method according to claim 1, wherein the metal seed layer is selected from the group consisting of copper, tin, cobalt, nickel, silver, tin-lead alloy, copper-nickel alloy, copper-chromium alloy, copper-ruthenium alloy, copper-rhodium alloy, copper-silver alloy, copper-iridium alloy, copper-palladium alloy, copper-platinum alloy, copper-gold alloy, copper-rare earth alloy, copper-nickel-silver alloy, copper-nickel-rare earth metal alloy, copper/tin bi-layer, chromium/copper-chromium alloy/copper multilayer and nickel/tin/copper multilayer.

3. The method according to claim 1 wherein the metal seed layer is selected from the group consisting of copper, copper-nickel alloy, copper-ruthenium alloy and copper-rhodium alloy.

4. The method according to claim 1 wherein the solder alloy deposit is selected from the group consisting of tin-silver-copper alloys and tin-silver-copper-nickel alloys.

5. The method according to claim 1 wherein the substrate is a printed circuit board, an IC substrate or an interposer.

6. The method according to claim 2 wherein the seed layer is selected from the group consisting of copper, copper-nickel alloy, copper-ruthenium alloy and copper-rhodium alloy.

7. The method according to claim 2 wherein the solder alloy deposit is selected from the group consisting of tin-silver-copper alloys and tin-silver-copper-nickel alloys.

8. The method according to claim 3 wherein the solder alloy deposit is selected from the group consisting of tin-silver-copper alloys and tin-silver-copper-nickel alloys.

9. The method according to claim 2 wherein the substrate is a printed circuit board, an IC substrate or an interposer.

10. The method according to claim 3 wherein the substrate is a printed circuit board, an IC substrate or an interposer.

11. The method according to claim 4 wherein the substrate is a printed circuit board, an IC substrate or an interposer.

* * * * *